US005485096A

United States Patent [19]

Aksu

[11] Patent Number: 5,485,096
[45] Date of Patent: Jan. 16, 1996

[54] PRINTED CIRCUIT BOARD TESTER HAVING A TEST BED WITH SPRING PROBES AND EASILY REPLACEABLE SWITCH CARDS

[76] Inventor: Allen Aksu, 1044 Santiago Dr., Newport Beach, Calif. 92660

[21] Appl. No.: 223,166

[22] Filed: Apr. 5, 1994

[51] Int. Cl.$^6$ .......................... G01R 1/073; G01R 31/02
[52] U.S. Cl. .............................................. 324/761; 324/754
[58] Field of Search ...................... 324/754, 761; 361/741, 748, 756; 439/64, 377, 378

[56] References Cited

U.S. PATENT DOCUMENTS

| | | | |
|---|---|---|---|
| 4,352,061 | 9/1982 | Matrone | 324/754 |
| 4,465,972 | 8/1984 | Sokolich | 324/754 |
| 4,952,872 | 8/1990 | Driller et al. | 324/761 |
| 5,159,265 | 10/1992 | Alfonso et al. | 324/761 |
| 5,216,361 | 6/1993 | Akar et al. | 324/761 |

*Primary Examiner*—Ernest F. Karlsen
*Assistant Examiner*—Russell M. Kobert
*Attorney, Agent, or Firm*—Plante and Strauss

[57] ABSTRACT

There is disclosed a printed circuit board test apparatus which has a test bed formed by a planar member having a plurality of through channels at close spacing across its surface to receive test probes. Each of the test probes comprises a tubular body having a top contact surface and a socket at its opposite end. A plurality of planar switch cards are provided with each card supporting, along one edge thereof, a plurality of pins which are disposed in rows at locations corresponding to the predetermined locations of the through channels of the test board. Each switch card has a plurality of electrical circuits which interconnect with selected pins and which are connected to selected contacts of a connector located at another extremity of the switch card. The switch cards are supported orthogonal to the planar test bed of the test equipment with the ends of the pins received in recesses of the test probes thereby establishing conductive paths from the surface contacts of the probes to the connector of the card. Each switch card is connected to the remainder of the test circuitry of the test equipment. Preferably components such as switching circuits are mounted on the switch cards to control the test functions of the test equipment.

20 Claims, 4 Drawing Sheets

PRINTED CIRCUIT BOARD TESTER HAVING A TEST BED WITH SPRING PROBES AND EASILY REPLACEABLE SWITCH CARDS

BACKGROUND OF THE INVENTION

1. Field of Invention

This invention relates to test equipment for testing of printed circuit boards and, in particular, to the construction of a circuit card (commonly referred to as a switch card) and its interconnection to electrical contacts of the printed circuit board test equipment.

2. Background of the Invention

Printed circuit boards are tested for circuit continuity and component integrity by the use of automated circuit board test equipment. This equipment is typically quite complex as it must have test probes which can contact various test points on a printed circuit board which are generally closely spaced. Commonly, the test equipment is provided with a "bed of nails" in which a plurality of evenly spaced test probes are located at evenly spaced increments on a grid, typically separated by distances of 0.1 inch or less.

Advances in circuit board and electronic component technology have escalated the spacing demands placed on circuit board test equipment. The state of the art technology requires circuit board test equipment capable of accessing test points which are spaced apart by as slight as 0.05 inch, or less.

While test probes can be evenly distributed across an expanded test bed surface which typically spans from 12 to about 36 inches in each direction, difficulty is experienced in providing reliable interconnections of probes in highly populated test beds to the internal circuitry of the test equipment.

Some of the earliest test equipment employed spring biased test pins (probes) with tails terminated with wires using soldering, crimping or wire wrapping. These wires, which were generally 2 to 6 feet long, provided electrical connection to the test equipment circuitry. The assembly of these circuit board test equipment was laborious and the circuit board test equipment was prone to failure because of the many mechanical connections.

An approach which has been used in a number of commercial test equipment has been to provide a plurality of parallel, closely spaced conductor plates (switch cards) which are provided with some type of edge connector along one edge of the switch card for electrical connection to the probes of the test equipment test bed. These cards are placed in a stacked array, orthogonal to the test bed of the test equipment and are usually provided with electrical components in a plurality of switching circuits for each of the individual probes of the test equipment.

A recent innovation has been to provide a flexible circuit which is carried on the switch card, and wrapped over one edge of the card to permit a plurality of cards to be stacked in a parallel side-by-side array with their edges abutting the test probes. The test probes have tails which seat against contact pads of the flexible circuit. With repeated use, the tails of the probes wear the flexible circuit, destroying continuity.

OBJECTIVES OF THE INVENTION

It is an objective of this invention to provide circuit board test equipment having test probes located at very close spacings, e.g., from 0.05 to 0.1 inch.

It is also an objective of this invention to simplify the interconnection of test probes to the electrical circuitry of the tester.

It is an additional objective of the invention to provide a reliable mechanical interconnection between the test probes and the circuitry of the test equipment, whereby the probes will not slip off their corresponding contacts and will not short out against adjacent contacts.

It is an additional objective of this invention to provide circuit board test equipment of improved overall reliability.

BRIEF DESCRIPTION OF THE INVENTION

This invention comprises a printed circuit board test apparatus which has a test bed formed by a planar member having a plurality of through channels at close spacing across its surface to receive test probes. Each of the test probes comprises a tubular body having a top contact surface and a socket at its opposite end. A plurality of planar switch cards are provided with each card supporting, along one edge thereof, a plurality of pins which are disposed in rows at locations corresponding to the predetermined locations of the through channels of the test board. Each switch card has a plurality of electrical circuits which interconnect with selected pins and which are connected to selected contacts of a connector located at another extremity of the switch card. The switch cards are supported orthogonal to the planar test bed of the test equipment with the ends of the pins received in recesses of the test probes thereby establishing conductive paths from the surface contacts of the probes to the connector of the card. Each switch card is connected to the remainder of the test circuitry of the test equipment. Preferably, components such as switching circuits are mounted on the switch cards to control the test functions of the test equipment.

BRIEF DESCRIPTION OF THE DRAWINGS

The invention will be described with reference to the FIGURES, of which.

DESCRIPTION OF THE PREFERRED EMBODIMENT

Figure 1:
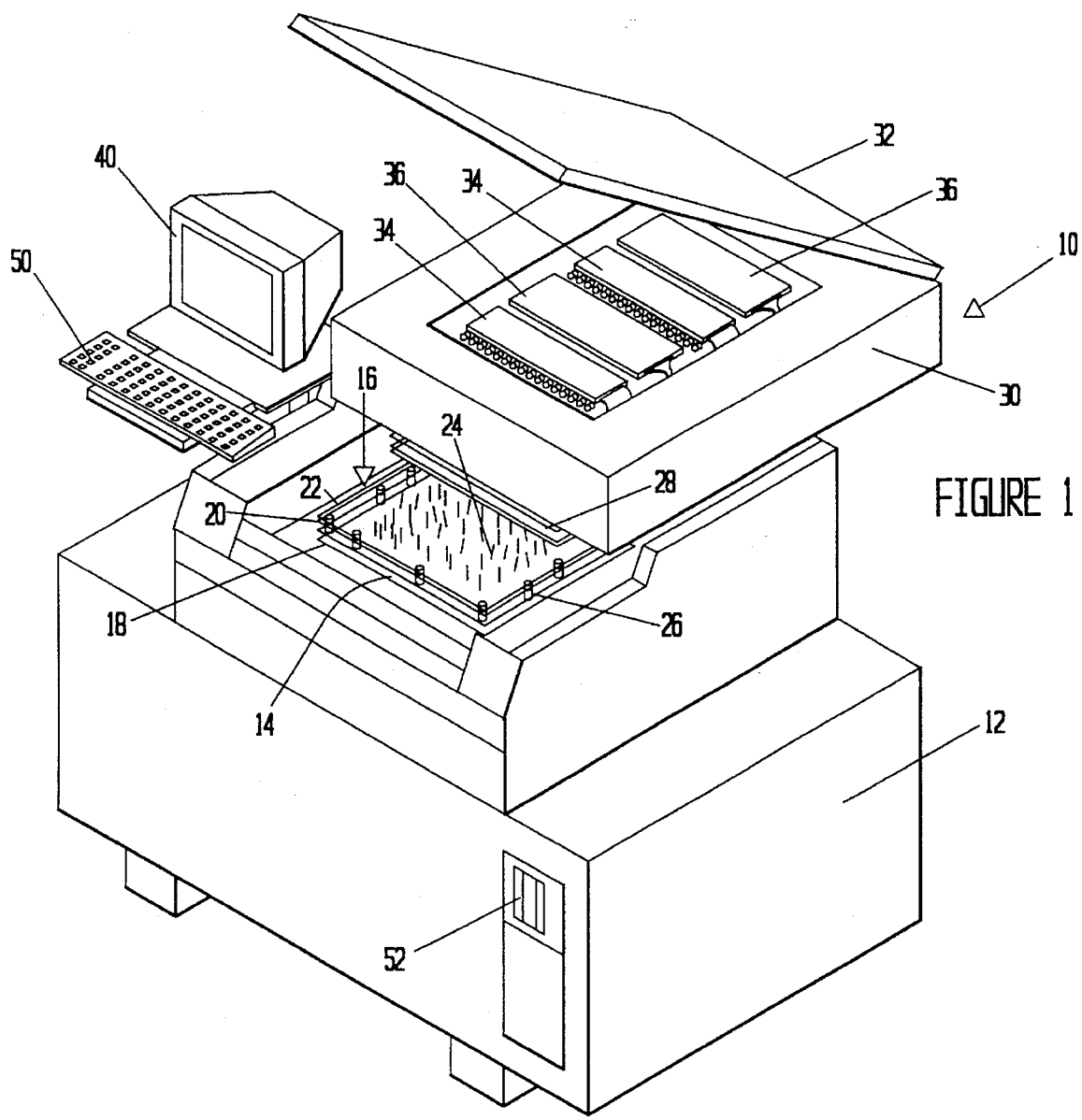
FIG. 1 is a perspective view of circuit board test equipment of the invention

Referring to FIG. 1, the circuit board test equipment (tester) 10 of the invention is illustrated. The circuit board tester 10 has a base cabinet 12 which houses the support frame and the mechanical platen actuator used in the device (not shown). The circuit board tester 10 has a conventional mechanical or hydraulic press which is housed in the base cabinet 12 and which raises the platen on which the test bed 14 resides. The test bed 14 of the circuit board tester 10 is fixedly secured to the vertically movable platen, and a test adapter 16 is mounted on the test bed.

The adapter 16 comprises a plurality of plates 18, 20 and 22 which are drilled with through apertures to receive straight pins 24 which can be tilted in the assembly to translate from the regular geometry of the grid of probes of the test bed to test points of the printed circuit board under test. The uppermost plate 22 has apertures drilled at precise locations to locate the upper ends of the pins at precise alignment with test points of the printed circuit board, while the lowermost plate 18 has apertures which align the lower ends of the pins precisely with the regular geometric spacing of the test bed 14. The intermediate plate 20 has apertures which align with those of the top plate 22 and bottom plate 18. A plurality of pins 24 are mounted in the aligned apertures of plates 18, 20 and 22 to translate the contact points on the test bed to the selected test points for the printed circuit board. The plurality of plates 18, 20 and 22 are secured together by stand offs or spacers 26 which are located about the periphery of the assembly.

The circuit board tester 10 illustrated in FIG. 1 is adapted for testing both sides of a printed circuit board and for this purpose, has a second adapter 28 that is associated with the upper test module. The upper test module is contained within cabinet 30 which is mounted on a horizontal track which allows it to be moved forward and rearwardly; it is illustrated in a rearward position, exposing the test area to provide access for placement of a printed circuit board within the circuit board tester.

The upper test cabinet 30 is shown with its cover 32 opened to reveal the connector sockets 34 and 36 used for interconnecting the switch cards to the electronic control circuit of the circuit board tester 10, which is contained within base cabinet 12. As illustrated, the upper cabinet 30 houses two adjacent, parallel rows of switch cards of which only the continuity LEDs 38 are visible in the illustration. Each switch card has two edge connectors of closely spaced contacts which plug into mating sockets 34 and 36 of multiple contact connectors. Two such connector sockets 34 and 36 are provided for each card and four connectors are thus shown for the two sets of parallel arrays of the switch cards.

The remainder of the circuit board tester includes a CRT monitor 40 and an operator keyboard 50 which are interconnected to the CPU of the unit. Additionally, the circuit board tester has one or more disk drives 52 to permit the operator to insert various proprietary programs for operating the circuit board tester.

Figure 2:
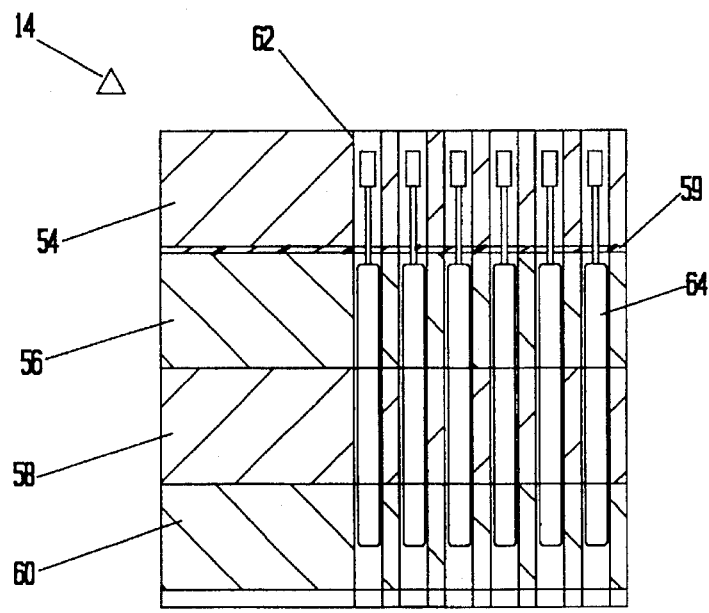
FIG. 2 is an elevational sectional view through the test bed of the circuit board test equipment, illustrating the probes in closely spaced through channels of the test bed.

FIG. 2 is a sectional view through a portion of the test bed 14 of the circuit board tester 10. Typically test beds having planar dimensions of 12 to 36 inches are used with thicknesses from 1 to about 3 inches. Because of the difficulty in drilling very closely spaced holes in thick insulating plates, it is common to assemble the test beds from several insulating plates which are precisely drilled and then stacked together in a precise alignment. As shown, the test bed is an assembly of four insulating plates 54, 56, 58 and 60 with aligned through holes that form through channels 62 at very close spacings, typically from about 0.05 to about 0.1 inch, center to center. These channels are located in parallel rows such on regular geometric spacing shown in FIG. 2. Alternatively, the through channels of adjacent rows can be displaced at half distance spacings from the immediately adjacent row. A test probe 64 can be placed in each of the through channels 62, or in selected channels, as desired by the user.

Figure 3:
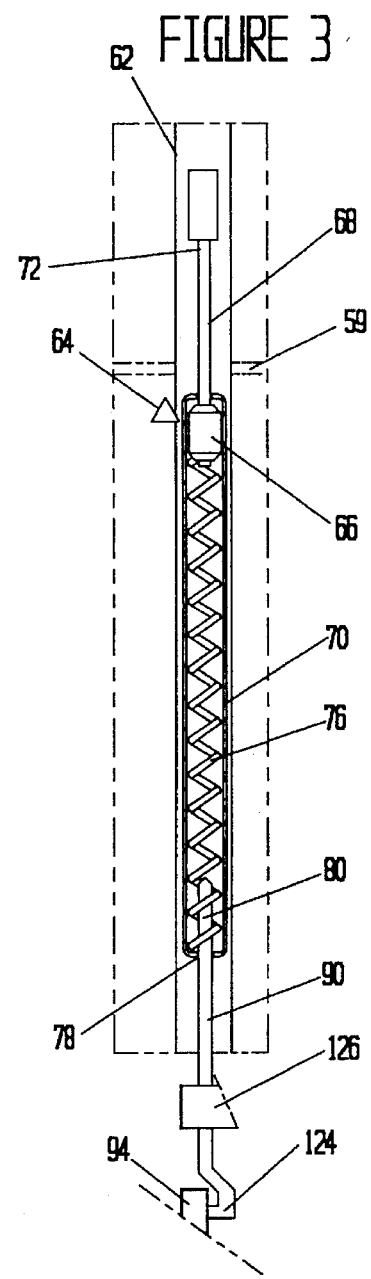
FIG. 3 is an enlarged sectional view of a test probe showing its connection to the pins of the switch card.

Referring now to FIG. 3, there is illustrated a sectional view through a test probe 64 used in the invention. As there illustrated, each test probe comprises a probe plunger 66 having a shaft 68 that is received within the probe housing 70. At its upper end 72, the shaft supports a contact 74 which can be cylindrical, as illustrated, or can have a pointed tip. As illustrated, the probe head has a generally cylindrical contact 74. The probe plate assembly includes one or two thin films 59 of a flexible plastic, e.g., Mylar, which has through apertures of lesser diameter than the probe head 74, thereby capturing the probes in the channels 62. The probe housing 70 is tubular, and contains a compression spring 76 which resiliently urges the probe plunger 66 into an extended position. The spring 76 also serves to maintain electrical continuity between the probe contact 74 and the probe housing 70. At its lower end, the probe housing has a central recess 78 which receives the upper end 80 of the pin 90 from the switch card 94 (shown in FIGS. 4–6). The Upper edge 92 of the switch card 94 and its connection to the bent lower end 124 of pin 90 is illustrated in FIG. 3 and the entire connector card is illustrated in elevational view in FIG. 4.

Figure 4:
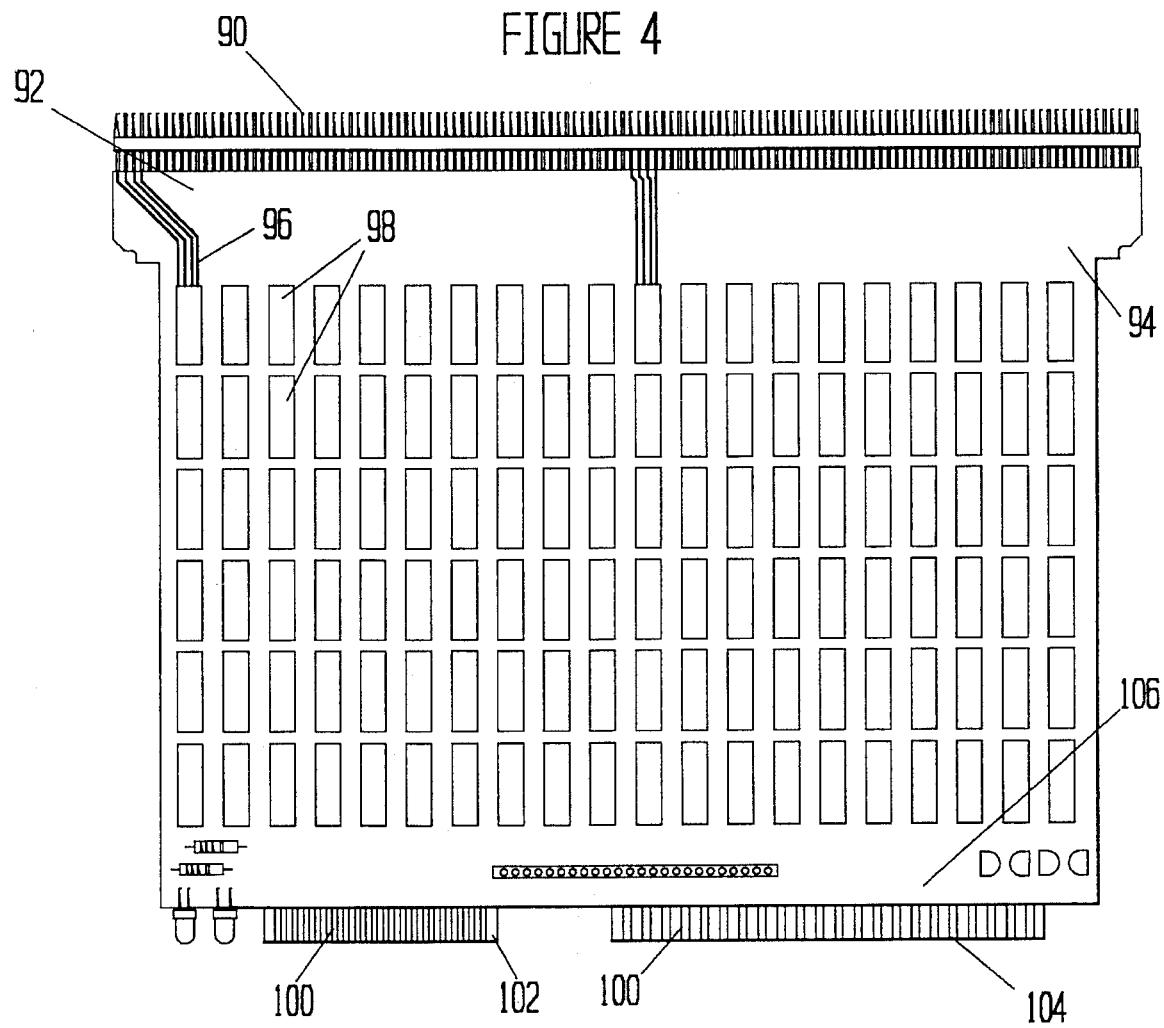
FIG. 4 is a side view of a typical switch card used in the invention.

Referring now to FIG. 4, the switch card 94 is a multiple layer printed circuit board which has a plurality of electrical circuits 96, one circuit for each of the individual pins 90 which are disposed along a longitudinal side edge 92 of the card 94 and which extend through an insulating spacer bar 126. Each of the electrical circuits 96 includes a plurality of integrated circuits 98 that function as switching elements for the circuit and each circuit 98 extends into connection with one of a plurality of contacts 100 of multiple contact connectors 102 and 104, which extend from the edge 106 of the switch card which is opposite the edge 92 which supports pins 90. The multiple contact connectors 102 and 104 plug into the sockets 34 and 36, previously described with reference to FIG. 1. The switch cards also are provided with connectors which permit interconnection of adjacent circuits cards, such as the multiple contact connector 108 which is shown adjacent the lower longitudinal edge 106 of the switch card.

Figures 5, 6:
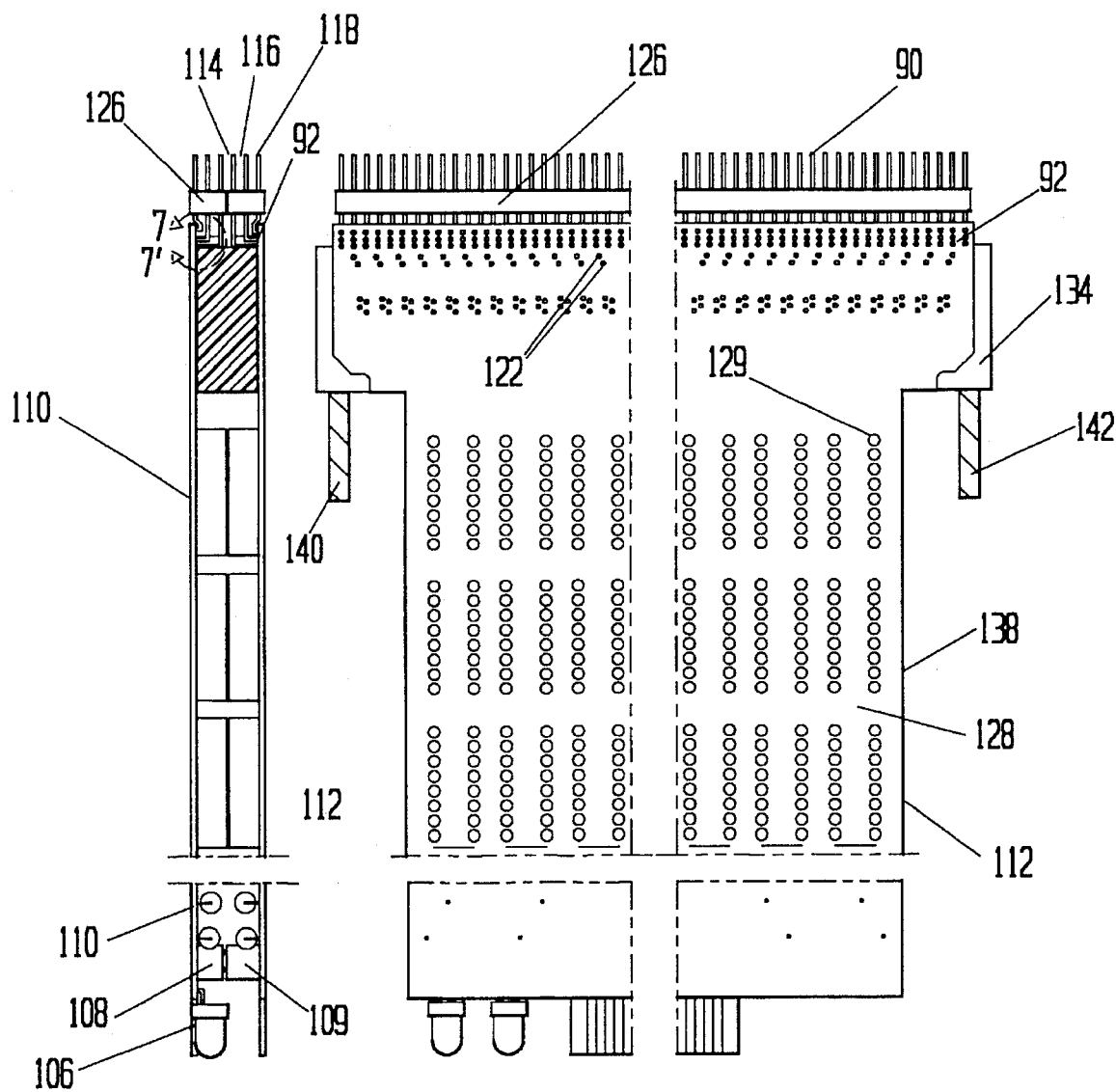
FIG. 5 is an edge view of the assembly of two switch cards as used in the invention, illustrating their support in the test equipment.
FIG. 6 is a partial side view of the assembly shown in FIG. 5.

Referring now to FIG. 5, there is illustrated an edge view of a pair of adjacent switch cards 110 and 112. Each switch card has a plurality of parallel rows of pins 90; three rows 114, 116 and 118 are shown for switch card 112. The pins 90 extend to soldered connections to contacts 122 (see FIG. 6) disposed along the upper edge 92 of each card and the pins have bent lower ends 124 and 130 (see FIG. 7) which extend to soldered connections to the contacts 122 and which remain out of contact with each other. An insulating spacer bar 126 extends along the upper edge 92 of each of the switch cards 112.

As shown in the lower portion of FIG. 5, the two switch cards 110 and 112 are interconnected by the connectors 108 and 109 along their lower edges 106. In this assembly, the switch card 110 is a master card and the switch card 112 is a slave card.

Figure 7:
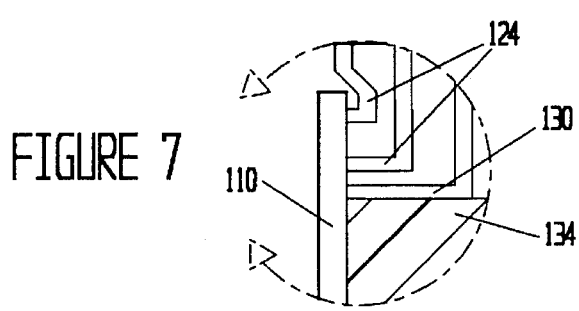
FIG. 7 is an enlarged view of the area within line 7—7' of FIG. 5.

FIG. 6 is a partial side view of the assembly shown in FIG. 4. As there illustrated, the switch card 112 has a plurality of soldered contacts 129 for attachment of the components 98 shown in FIG. 4. The switch cards such as 112 are supported in the assembled tester by transverse bars 134 which are formed of an insulating material having adequate structural strength to absorb the compressive load applied to the test probes. As illustrated in FIG. 7, which is an enlarged view of the area within line 7—7' of FIG. 5, the bent lower ends 124 and 130 of pins 90 extend to soldered connections to the circuit cards such as 110 are carried on the support bars 134 by the bent lowermost bent ends 130 of the pins. These bent ends 130 abut against the support bars 134. Referring to FIG. 6, the bars 134 extend beyond the side edges 136 and 138 of the switch cards such as 112 and rest on rails 140 and 142 of the supporting frame of the tester 10.

The supporting frame of the circuit board tester thus secures the switch cards into electrical contact with the respective sockets of the probes which are captured in the circuit board tester plate, and provides the mechanical support for the compressive loading placed on the probes. The entire apparatus can be quickly and efficiently assembled by plugging in the switch cards to register each of its pins in electrical and physical contact with the respective sockets of the probes. The switch cards are locked in a secured assembly and the multiple contact connector sockets 34 and 36 shown in FIG. 1 are attached to the edge connectors of the cards in their ganged assembly, thereby completing all the test circuits of the circuit board tester from each of the active test pins 90.

The switch cards are readily removable and are interchangeable so that in the event of any defect which occurs during use of the circuit board tester, a replacement card can be easily and quickly inserted to replace a defective card. Since the pins of the switch card and the sockets or recesses of the probes are relatively resistant to wear, repeated removal and replacement of cards will not damage either the cards or the probes. Furthermore, the compressive force exerted on the probes of the test bed during testing of a printed circuit board is carried by the support bars 134, which are located between adjacent switch cards and is not transmitted to the switch cards. This also greatly reduces the wear and stress placed on the switch cards extending their life and reducing maintenance requirements.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. A printed circuit board test apparatus including a support frame and vertically moveable platen comprising:

a. a test bed formed as a planar member residing on said platen and having a plurality of through channels located at predetermined locations across the surface thereof to form a plurality of row of through channels;

b. a plurality of test probes, located one each in selected channels of said through channels, each of said test probes comprising a probe plunger which has an electrical contact at its upper end, and which is received within a tubular body and resiliently biased into an extended position in said body by a compression spring, also received within said body, and with said body having a pin-receiving socket at its end opposite said probe plunger;

c. a plurality of planar switch cards, each switch card supporting along one edge thereof a plurality of pins attached at one end thereof to said switch card and having their opposite ends disposed in rows at locations corresponding to said predetermined locations, said switch card supporting at another location thereon at least one connector having a plurality of connector contacts, with conductive circuit means carried on said switch card to interconnect selected ones of said pins to selected ones of said connector contacts, with said opposite ends of said pins received in respective ones of said sockets thereby establishing a plurality of conductive paths from the electrical contacts of selected ones of said probes to selected ones of said connector means; and d. a plurality of said pins being bent at said one end substantially orthogonal to its respective switch card;

e. a plurality of support bars attached to said frame and disposed parallel to said switch cards, each bar of said plurality located between adjacent switch cards adjacent said one edge thereof, with the bent ends of said pins supported by said support bars to support said planar switch cards orthogonal to said planar member.

2. The test apparatus of claim 1 wherein said electrical contacts of said test probes are cylindrical heads carried on the end of a shaft which is slidably received in said tubular bodies and said compression springs bias said heads outwardly from said tubular bodies.

3. The test apparatus of claim 1 wherein said planar member is a test bed having a plurality of evenly spaced through channels across substantially its entire surface.

4. The test apparatus of claim 1 wherein said conductive circuit means on said planar switch cards comprise printed circuits interconnecting with a plurality of active electronic components carried on said planar switch cards.

5. The test apparatus of claim 1 wherein said planar switch cards carry interconnecting conductors in mutual alignment whereby adjacent switch cards are interconnected in pairs.

6. The test apparatus of claim 1 wherein said connectors on said planar switch cards are edge card connectors.

7. The test apparatus of claim 1 wherein said opposite ends of said pins extend parallel to the planar switch cards.

8. The test apparatus of claim 7 wherein said switch cards also include insulating spacer bars, one each, extending adjacent said one edge of said circuit cards and surrounding said opposite ends of said pins.

9. The test apparatus of claim 1 wherein said switch card support bars are attached to said frame by at least a pair of rails positioned orthogonal to said support bars and supported by the frame of said test apparatus, said rails being located, one each at opposite ends of said support bars to carry said support bars.

10. The test apparatus of claim 9 wherein said bent one ends of said pins abut against the upper edge of said support bars.

11. The test apparatus of claim 3 including at least one test adapter supported on said test bed, said test adapter comprising a plurality of planar plates of insulating material which are supported at spaced apart positions by spacers, with the first plate thereof which is adjacent said test bed having a plurality of holes which align with the test probes of said test bed, and with the opposite plate thereof which is on the opposite side of said test fixture having a like plurality of holes which align with the test points of the printed circuit board to be tested, and with a plurality of straight metal pins received in said holes of said plates to provide electrical connection between said probes of said test bed and said test points.

12. The test apparatus of claim 11 including at least one intermediate plate, located between said first and opposite plates with a plurality of spacers positioned to place said intermediate plate at a spaced apart and parallel position relative to said first and opposite plates, which intermediate plate has a like plurality of holes located intermediate the locations of corresponding holes in said first and opposite plates, whereby corresponding holes in said first, intermediate and opposite plates are in alignment to receive said straight metal pins.

13. A pair of switch cards for use with a bed of nails type circuit board tester each of which comprises:

a. planar insulating board;

b. a plurality of evenly spaced apart pins mounted along one side edge of said board;

c. at least one multiple contact connector mounted along another side edge of said board removed from said pins;

d. a plurality of printed circuits disposed across the surface of said board, including a plurality of electronic components mounted on one side of said board with said circuits interconnecting selected ones of said pins and ones of said components to selected ones of said contacts of said multiple contact connector; and e. at least a second multiple contact connector located on said one side of said board at a selected location to engage in electrical and physical attachment to a coacting connector on the other of said pair of switch cards.

14. The pair of switch cards of claim 13 wherein said pins are metal pins having straight upper ends which extend parallel to their respective planar insulating board and bent lower end which are orthogonal to said planar insulating board, with the ends of said bent lower ends connected to said planar insulating board.

15. The pair of switch cards of claim 14 wherein said switch cards also include insulating spacer bars, one each, extending adjacent said one edge of said planar insulating boards and surrounding the lower portions of the straight upper ends of said pins.

16. The pair of switch cards of claim 13 in a parallel, face-to-face array, with said second connectors of said switch cards assembled together.

17. The pair of switch cards of claim 13 wherein said pins are positioned in a plurality of parallel rows of pins on each of said planar insulating boards.

18. The pair of switch cards of claim 17 including an insulating spacer bar extending adjacent said one edge of each of said planar insulating boards and surrounding the straight upper ends of said pins.

19. In a printed circuit board tester having a frame and a planar test bed with a multiplicity of through channels in which are received electrical conductors which extend between tester contacts on the upper surface thereof and the lower surface thereof, and a plurality of switch cards which are supported in a parallel array, orthogonal to said planar test bed with one edge of each adjacent the lower surface of said planar test bed, and with a plurality of pins located on, and attached, at one end thereof, along said one edge of each of said switch cards, the improvement comprising:

a. a plurality of said pins having their said one ends bent to provide legs orthogonal to said switch card; and b. a plurality of support bars attached to said frame and disposed parallel to said switch cards, each bar of said plurality located between adjacent switch cards adjacent said one edge thereof, with the legs of said pins supported by said support bars to support said planar switch cards orthogonal to said planar member.

20. The test apparatus of claim 19 including at least a pair of rails positioned orthogonal to said support bars and supported by the frame of said test apparatus, said rails being located, one each at opposite ends of support bars to carry said support bars.

* * * * *